United States Patent
Dickey et al.

(10) Patent No.: US 8,637,117 B2
(45) Date of Patent: Jan. 28, 2014

(54) INHIBITING EXCESS PRECURSOR TRANSPORT BETWEEN SEPARATE PRECURSOR ZONES IN AN ATOMIC LAYER DEPOSITION SYSTEM

(75) Inventors: Eric R. Dickey, Portland, OR (US); William A. Barrow, Beaverton, OR (US)

(73) Assignee: Lotus Applied Technology, LLC, Hillsboro, OR (US)

( * ) Notice: Subject to any disclaimer, the term of this patent is extended or adjusted under 35 U.S.C. 154(b) by 120 days.

(21) Appl. No.: 12/905,045

(22) Filed: Oct. 14, 2010

(65) Prior Publication Data

US 2011/0256323 A1    Oct. 20, 2011

Related U.S. Application Data

(60) Provisional application No. 61/251,639, filed on Oct. 14, 2009.

(51) Int. Cl.
*C23C 16/455* (2006.01)
*C23C 16/28* (2006.01)

(52) U.S. Cl.
USPC ......... 427/248.1; 427/532; 427/534; 427/557

(58) Field of Classification Search
None
See application file for complete search history.

(56) References Cited

U.S. PATENT DOCUMENTS

| | | |
|---|---|---|
| 2,384,500 A | 9/1945 | Stoll |
| 2,458,394 A | 1/1949 | Luboshez |
| 3,314,393 A | 7/1963 | Haneta |
| 3,379,803 A | 5/1964 | Tittmann et al. |
| 3,650,042 A | 3/1972 | Boerger et al. |
| 3,964,434 A | 6/1976 | Adler et al. |
| 4,220,117 A | 9/1980 | Shinohara |
| 4,728,406 A | 3/1988 | Banerjee et al. |
| 4,803,947 A | 2/1989 | Ueki et al. |
| 5,266,116 A | 11/1993 | Fujioka et al. |
| 5,411,592 A | 5/1995 | Ovshinsky et al. |
| 5,462,602 A | 10/1995 | Misiano et al. |
| 5,484,746 A * | 1/1996 | Ichikawa et al. .......... 117/8 |
| 5,629,054 A | 5/1997 | Kanai |
| 5,817,550 A | 10/1998 | Carey et al. |
| 6,287,988 B1 | 9/2001 | Nagamine et al. |

(Continued)

FOREIGN PATENT DOCUMENTS

| | | |
|---|---|---|
| EP | 1795625 A1 | 6/2007 |
| JP | 1985-030124 A | 2/1985 |

(Continued)

OTHER PUBLICATIONS

Kim, Journal of Korean Physical Society, V49, No. 3, Sep. 2006, p. 271.*

(Continued)

*Primary Examiner* — Joseph Miller, Jr.
(74) *Attorney, Agent, or Firm* — Stoel Rives LLP

(57) ABSTRACT

Systems and methods for ALD thin film deposition include a mechanism for removing excess non-chemisorbed precursors from the surface of a substrate in a translation-based process involving multiple separate precursor zones. Excess precursor removal mechanisms according to the present disclosure may introduce localized high temperature conditions, high energy conditions, or azeotropes of the excess precursor, to liberate the excess precursor before it reaches a separate precursor zone, thereby inhibiting CVD deposition from occurring without causing heat-induced degradation of the substrate.

22 Claims, 3 Drawing Sheets

(56) References Cited

U.S. PATENT DOCUMENTS

| | | |
|---|---|---|
| 6,576,053 B1 | 6/2003 | Kim et al. |
| 6,620,288 B2 | 9/2003 | Shinohara et al. |
| 6,758,911 B2 | 7/2004 | Campbell et al. |
| 6,821,563 B2 | 11/2004 | Yudovsky |
| 6,888,172 B2 | 5/2005 | Ghosh |
| 6,926,572 B2 | 8/2005 | Park et al. |
| 7,074,719 B2 | 7/2006 | Kim et al. |
| 7,413,982 B2 | 8/2008 | Levy |
| 7,456,429 B2 | 11/2008 | Levy |
| 7,476,420 B2 | 1/2009 | Skarp et al. |
| 2002/0031645 A1* | 3/2002 | Sano et al. ............ 428/143 |
| 2002/0094385 A1* | 7/2002 | Raychaudhuri et al. ... 427/385.5 |
| 2002/0170496 A1 | 11/2002 | Ha et al. |
| 2003/0172873 A1 | 9/2003 | Fischer et al. |
| 2004/0096593 A1* | 5/2004 | Lukas et al. ............ 427/558 |
| 2004/0194691 A1 | 10/2004 | George et al. |
| 2004/0209126 A1* | 10/2004 | Ziegler et al. ............ 428/702 |
| 2004/0261703 A1 | 12/2004 | Kobrin et al. |
| 2005/0113527 A1* | 5/2005 | Perrella ............ 525/310 |
| 2005/0172897 A1 | 8/2005 | Jansen |
| 2005/0249875 A1 | 11/2005 | Sasaki et al. |
| 2006/0096541 A1* | 5/2006 | Seo et al. ............ 118/724 |
| 2007/0224348 A1* | 9/2007 | Dickey et al. ............ 427/248.1 |
| 2007/0281089 A1 | 12/2007 | Heller et al. |
| 2008/0026162 A1 | 1/2008 | Dickey et al. |
| 2008/0092814 A1 | 4/2008 | Yan et al. |
| 2008/0193739 A1 | 8/2008 | Dickey et al. |
| 2009/0199964 A1 | 8/2009 | Fayet et al. |
| 2009/0297696 A1 | 12/2009 | Pore et al. |
| 2010/0143710 A1 | 6/2010 | Dickey et al. |
| 2010/0189900 A1 | 7/2010 | Dickey et al. |

FOREIGN PATENT DOCUMENTS

| | | |
|---|---|---|
| JP | 1993-078818 A | 3/1993 |
| JP | 2006-124784 A | 5/2006 |
| KR | 10-2004-0035083 A | 4/2004 |
| WO | WO 2006/093168 A1 | 9/2006 |
| WO | WO2009-004117 * | 1/2009 |

OTHER PUBLICATIONS

Erlat et al., Ultra-high Barrier Coatings on Polymer Substrates for Flexible Optoelectronics: Water Vapor Transport and Measurement Systems, 47th Ann. Tech. Conf. Proc., pp. 654-659, Society of Vacuum Coaters, Apr. 2004, 6 pages.

Korean Intellectual Property Office, International Search Report and Written Opinion, International Application No. PCT/US2010/0527757, dated Oct. 14, 2010, 13 pages.

* cited by examiner ents of the prior art.

INHIBITING EXCESS PRECURSOR TRANSPORT BETWEEN SEPARATE PRECURSOR ZONES IN AN ATOMIC LAYER DEPOSITION SYSTEM

RELATED APPLICATIONS

This application claims the benefit under 35 U.S.C. §119 (e) from U.S. Provisional Patent Application No. 61/251,639, filed Oct. 14, 2009, which is incorporated herein by reference.

TECHNICAL FIELD

The field of the present disclosure relates to thin film deposition, including atomic layer deposition (ALD) on flexible substrates such as polymer films.

BACKGROUND

Atomic layer deposition ("ALD"), formerly known as atomic layer epitaxy ("ALE"), is a thin film deposition process that has several benefits over other thin film deposition methods, such as physical vapor deposition ("PVD") (e.g., evaporation or sputtering) and chemical vapor deposition ("CVD"), as described in Atomic Layer Epitaxy (T. Suntola and M. Simpson, eds., Blackie and Son Ltd., Glasgow, 1990).

In contrast to CVD, in which the substrate is exposed to multiple precursors simultaneously present in the reaction chamber, the precursor exposures in ALD processing are sequential, so that the substrate is exposed to only one precursor at a time. Successful ALD growth has conventionally involved the sequential introduction of two or more different precursor vapors into a reaction space around a stationary substrate in a deposition system known as a traveling wave reactor. ALD is conventionally performed at elevated temperatures and low pressures. For example, the reaction space may be heated to between 200° C. and 600° C. and operated at a pressure of between 0.1 mbar and 50 mbar. In a typical traveling wave type ALD reactor, the reaction space is bounded by a reaction chamber sized to accommodate one or more substrates. One or more precursor material delivery systems (also known as "precursor sources") are typically provided for feeding precursor materials into the reaction chamber.

After the substrates are loaded into the reaction chamber and heated to a desired processing temperature, a first precursor vapor is directed over the substrates. Some of the precursor vapor chemisorbs or adsorbs on the surface of the substrates to make a monolayer. The molecules of precursor vapor will typically not attach to other like molecules and the process is therefore self-limiting. However, some precursors may tend to physisorb or otherwise attach to like molecules at the surface of the substrate in excess non-chemisorbed amounts. After exposure to the first precursor vapor, the reaction space is purged to remove excess amounts of the first vapor and any volatile reaction products. Purging is typically accomplished by flushing the reaction space with an inert purge gas that is non-reactive with the first precursor. For ALD deposition, the purge conditions and duration are sufficient to remove substantially all non-chemisorbed precursor. After purging, a second precursor vapor is introduced. Molecules of the second precursor vapor chemisorb or otherwise react with the chemisorbed first precursor molecules to form a thin film product of the first and second precursors. To complete the ALD cycle, the reaction space is again purged with an inert purge gas to remove any excess of the second vapor as well as any volatile reaction products. The steps of first precursor pulse, purge, second precursor pulse, and purge are typically repeated hundreds or thousands of times until the desired thickness of the film is achieved.

U.S. patent application Ser. No. 11/691,421, filed Mar. 26, 2007 and published as Pub. No. US 2007/0224348 A1 of Dickey et al. ("the '421 application") describes various methods and systems for atomic layer deposition on flexible substrates. The specification of the '421 application is incorporated herein by reference in its entirety. The '421 application describes ALD deposition methods involving alternating exposure of a substrate to first and second precursor gases without the use of dynamically pulsing precursor and purge gas flows as in conventional traveling wave ALD reactors. In the systems and methods of the '421 application, a substrate such as a flexible web is reciprocatingly moved along an undulating path through two or more precursor chambers or zones separated by one or more isolation chambers or zones to accomplish atomic layer deposition of thin films on the surface of the substrate. As the substrate traverses between the precursor zones, it passes through a series of flow-restricting passageways of an isolation zone into which an inert gas is injected to inhibit migration of precursor gases out of the precursor zones.

The present inventors have discovered that, when the system of the '421 application is used with trimethylaluminum (TMA) and water ($H_2O$) as the first and second precursors to deposit alumina ($Al_2O_3$) thin films, for a given set of conditions of water dose strength, source temperature, and zone separation there is a substrate translation speed above which excess non-chemisorbed water molecules seem to be transported with the substrate into the TMA precursor zone. Experimental observations suggesting excess water is being transported into the TMA precursor zone at high speed include an observed increase in the thin film deposition rate per cyclical exposure to the precursors with an attendant decrease in barrier layer properties of the thin film, and deposition of $Al_2O_3$ on walls of the TMA precursor zone of the deposition system at the location where the substrate first encounters the TMA precursor vapor. These observations are consistent with CVD-type deposition in the TMA precursor zone.

It is expected that precursors other than water may exhibit similar unwanted transport behavior at some combination of process conditions and high substrate transport speed. For example, a precursor that tends to adhere strongly to itself (e.g., a precursor that has a relatively high surface tension against the inert gas used to isolate the precursors from one another), has a low vapor pressure, and/or that exhibits strong physisorption to the surface of the substrate may be more likely to be transported with the substrate into the other precursor zone.

The present inventors have identified a need to inhibit excess non-chemisorbed amounts of a first precursor from being transported with the substrate into contact with a reactive second precursor, and have devised methods and systems for quickly removing, desorbing, or liberating non-chemisorbed amounts of the first precursor from the surface of the substrate and inhibiting them from migrating into contact with the second precursor.

DETAILED DESCRIPTION OF PREFERRED EMBODIMENTS

In accordance with embodiments described herein, a substrate is moved between adjacent zones each having a different precursor chemical or isolation fluid present therein, as is described in greater detail in the '421 application. In alternative embodiments (not shown), the precursor zones and isolation zones are moved relative to the substrate, as by moving a deposition head in which the zones are formed, as described in U.S. Pat. No. 7,413,982 B2 of Levy, for example. As the substrate or deposition head is advanced, each segment of the substrate is preferably exposed to precursors in the precursor zones long enough to accomplish the requisite adsorption and reaction of precursor chemicals on the substrate surface. An isolation zone interposed between the precursor zones inhibits mixing of the different precursor gases in a single zone. The substrate is moved relative to the zones to achieve a thin film coating consistent with the coatings deposited by a conventional traveling wave-type ALD process. To inhibit transport or migration of unwanted precursor between the precursor zones, an excess precursor removal mechanism such as a heater, a plasma generator, or a source of microwave radiation is placed between the first and second precursor zones to liberate and remove excess non-chemisorbed precursor from the surface of the substrate after the substrate is exposed to the first precursor zone and before it is exposed to the second precursor zone.

Figure 1:
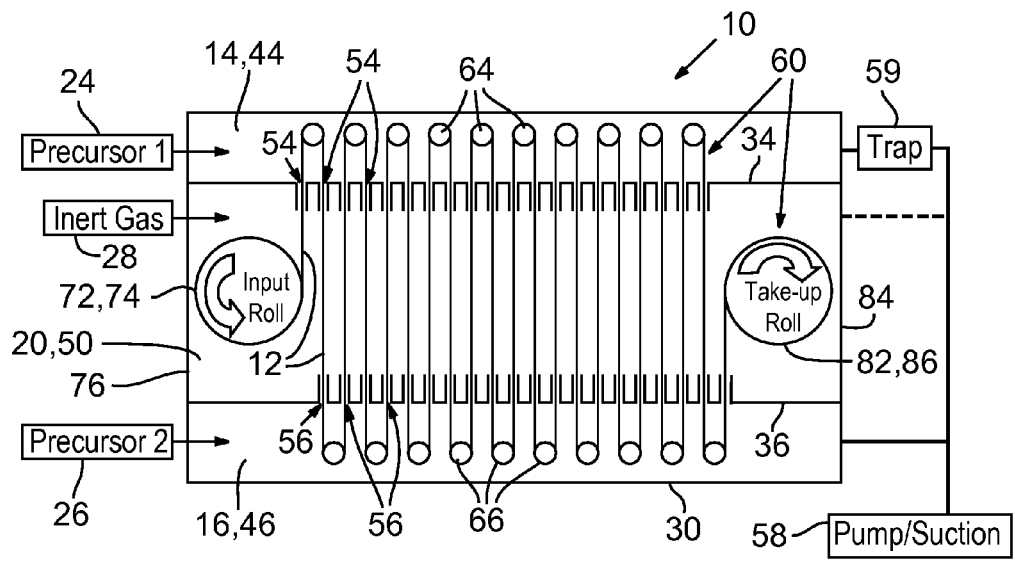
FIG. 1 is a schematic cross-sectional diagram illustrating one embodiment of a prior-art system for thin film deposition in which the present invention may be employed.

FIG. 1 is a schematic cross-section view of a system 10 according to a first embodiment for the deposition of a thin-film coating onto a flexible substrate 12 (shown in profile in FIG. 1), such as a web of plastic film or metal foil, for example. With reference to FIG. 1, system 10 includes first and second precursor zones 14 and 16, respectively, separated by an intermediate isolation zone 20 in which an inert fluid is present. The inert fluid may comprise an inert liquid, but more preferably consists essentially of an inert gas, such as nitrogen ($N_2$). When in use, reactive first and second precursor gases (Precursor 1 and Precursor 2) are introduced into the respective first and second precursor zones 14, 16 from first and second precursor delivery systems 24, 26. Precursor delivery systems 24, 26 may include precursor source containers (not shown) located outside or within precursor zones 14, 16. Additionally or alternatively, precursor delivery systems 24, 26 may include piping, pumps, valves, tanks, and other associated equipment for supplying precursor gases into precursor zones 14, 16. An inert gas delivery system 28 is similarly included for injecting inert gas into isolation zone 20.

In the embodiment shown, precursor zones 14, 16 and isolation zone 20 are bordered by an outer reaction chamber housing or vessel 30, divided by first and second dividers 34, 36 into three sub-chambers, namely, a first precursor chamber 44, a second precursor chamber 46 and an inert gas chamber 50. Vessel 30 may comprise a pressure vessel or vacuum vessel substantially isolating the process space from the external environment. In other embodiments, the vessel 30 may have entrance and exit passageways for interfacing with other process modules or equipment. A series of first passageways 54 through first divider 34 are spaced apart along a general direction of travel of substrate 12, and a corresponding series of second passageways 56 are provided through second divider 36. The passageways 54, 56 are arranged and configured for substrate 12 to be threaded therethrough back and forth between first and second precursor zones 14, 16 multiple times, and each time through isolation zone 20. For a web substrate, passageways 54, 56 preferably comprise slits (slit valves) having a width that is slightly greater than the thickness of substrate 12 and a length (not shown) extending into the plane of FIG. 1 (i.e., normal to the page) and that is slightly greater than a width of the substrate. Isolation zone 20 is, thus, preferably separated (albeit imperfectly) from the first precursor zone 14 by first divider 34 and from second precursor zone 16 by second divider 36.

To inhibit mixing of non-adsorbed quantities of the first and second precursor gases in one of the chambers 44, 46, 50, the system 10 is configured and operated to inhibit the free migration of the first precursor gas (Precursor 1) from first precursor zone 14 into isolation zone 20 and the migration of the second precursor gas (Precursor 2) from second precursor zone 16 into isolation zone 20. Passageways 54, 56 are preferably configured to restrict the flow of gases between the zones 14, 16, 20, to limit diffusion of precursor gases into a common zone. Passageways 54, 56 may include slits sized only slightly thicker and wider than the thickness and width of the substrate passing through them.

To help isolate the first precursor gas from the second precursor gas, pressure differentials are preferably established between the isolation zone 20 and the first precursor zone 14 and between the isolation zone 20 and the second precursor zone 16. In one embodiment, the pressure differentials may be generated by injecting inert gas into isolation zone 20 at a pressure greater than the operating pressure of the precursor zones 14, 16, and then passively exhausting gases from the precursor zones 14, 16. In another embodiment, the exhaust from precursor zones 14, 16 could be controlled relative to a passive exhaust from isolation zone 20 or by throttling an exhaust flow from isolation zone 20. Pressure differentials may also be generated by pumping from precursor zones via a pump 58 or another source of suction.

In one example, isolation zone 20 operates at a pressure of approximately 5 millitorr (i.e., the inert gas injection pressure may be 5 millitorr), and pressure differentials of approximately 0.1 millitorr are maintained between isolation zone 20 and each of the precursor zones 14, 16, so that an operating pressure of approximately 4.9 millitorr is maintained in precursor zones 14, 16 by way of suction applied to precursor zones 14, 16 by pump 58. Lower and significantly higher pressure differentials may also be used in some embodiments. For example, the nominal pressure during deposition may be approximately 1.5-2.0 Torr, with nitrogen inert gas flow adjusted to provide a slight pressure differential between isolation zone 20 and precursor zones 14, 16 (isolation zone 20 at a slightly higher pressure than the precursor zones). System 10 may be operated at a wide range of temperatures, including temperatures ranging from room temperature or below to several hundred degrees centigrade. In some embodiments, precursors 1, 2 and inert gas 28 may be maintained at an operating temperature of approximately 75° C.

A substrate transport mechanism 60 of system 10 includes multiple turning guides for guiding substrate 12, including a set of first turning guides 64 spaced apart along first precursor zone 14 and a second set of turning guides 66 spaced apart along second precursor zone 16. Turning guides 64, 66 cooperate to define an undulating transport path of substrate 12 as it advances through system 10. The substrate transport mechanism 60 may include a payout spool 72 for paying out substrate 12 from a first coil (input roll 74) for receipt at a first end 76 of isolation zone 20, vessel 30, or one of the precursor zones 14, 16. The substrate transport mechanism 60 may further include a take-up spool 82 for receiving the coated substrate 12 from a second end 84 of isolation zone 20, vessel 30, or one of the precursor zones 14, 16 opposite first end 76, and coiling the substrate 12 into a take-up roll 86 or second coil. Payout spool 72 and/or take-up spool 82 may be located within vessel 30, such as within isolation zone 20, as depicted in FIG. 1. Alternatively, one or both of payout and take-up spools 72, 82 may be located outside of vessel 30 (i.e., outside of isolation zone 20 and first and second precursor zones 14, 16) and fed into vessel through an entrance and/or exit passage (not shown) in the wall of vessel 30.

The system 10 illustrated in FIG. 1 includes ten first turning guides 64 and ten second turning guides 66, for providing ten full cycles of ALD growth. In one example, the system of FIG. 1 may be used to deposit a coating of aluminum oxide ($Al_2O_3$) approximately ten angstroms (10 Å) thick using TMA as Precursor 1 and water as Precursor 2. Additional ALD cycles may be added to system 10 by adding pairs of turning guides or by reversing the direction of substrate transport and rewinding substrate 12 onto input roll 72 to thereby transport the substrate through the system more than once.

Figure 3:
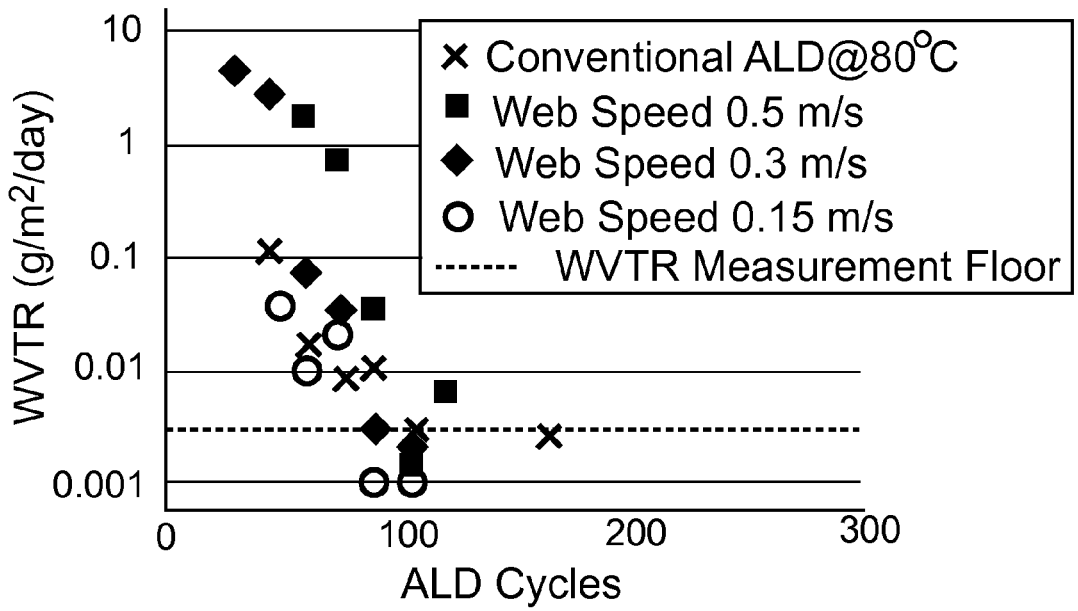
FIG. 3 is a scatter plot of water vapor transmission rate data for $Al_2O_3$ films deposited on 125 μm thick PET substrate using the system of FIG. 2 in band mode at 75° C. and comparison data for $Al_2O_3$ films deposited on 125 μm thick PET in a conventional traveling wave reactor at 80° C.

In other embodiments (not shown), a transport mechanism for effecting relative movement between a substrate and precursor zones may comprise a different mechanism for transporting a rigid or flexible substrate along or through a series of precursor zones and isolation zones between the precursor zones, as illustrated in FIG. 3 of the '421 application for example, or by rotation of a disc or cylindrical substrate or platen through precursor zones and inert gas zones. In still other embodiments, a transport mechanism may move a miniaturized deposition head relative to the substrate surface, as described in U.S. Pat. No. 7,413,982 B2 of Levy.

Figure 2:
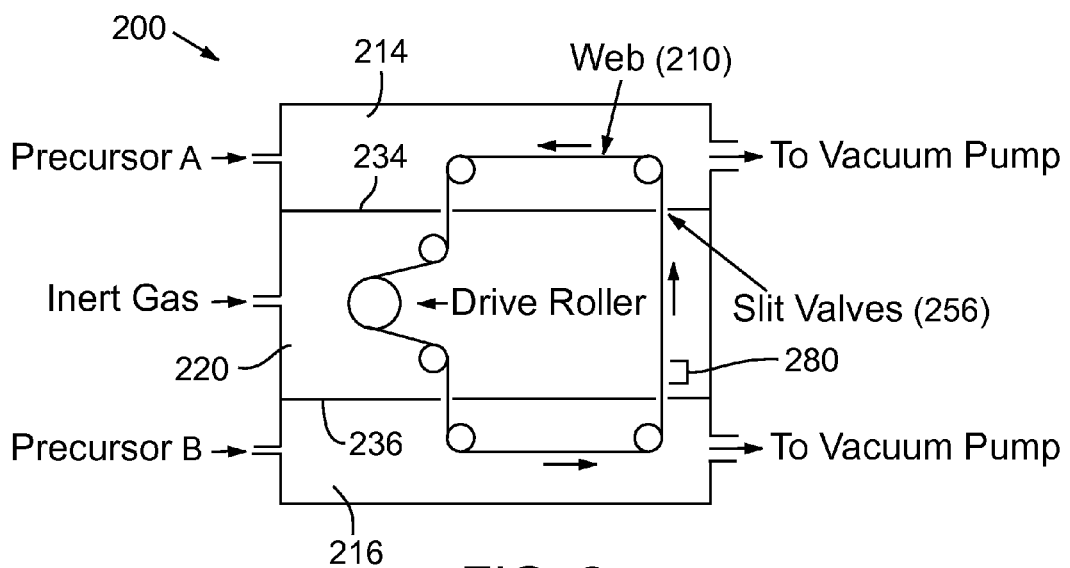
FIG. 2 is a simplified schematic cross-sectional diagram of a thin film deposition system in accordance with an embodiment illustrating a flexible substrate loop circulating in a band mode of operation for ALD deposition on a flexible substrate.

FIG. 2 is a cross-section schematic representation of a simplified thin-film deposition system 200 operating in band mode. In this configuration a flexible web loop or band 210 is passed repeatedly through the precursor zones 214, 216 and isolation zone 220 in a closed loop. As the web is driven for travel between zones 214, 216, it passes through slit valves 256 in zone dividers 234, 236, as in the system of FIG. 1. In an experimental system according to FIG. 2, a relatively slow web transport speed of 0.15 meter per second (m/s) yielded dwell times of about 6 to 7 seconds per revolution of the web (i.e., per cycle) in each of precursor zones 214 and 216, and a dwell time of about 1 or 2 seconds per cycle in isolation zone 220 (the path through the isolation zone 220 being longer around the drive roller illustrated in FIG. 2 than at the opposite side of the loop). The dwell times in each of the zones becomes proportionately shorter for higher web transport speeds.

FIG. 3 illustrates water vapor transmission rates (WVTR) for $Al_2O_3$ thin films deposited on polyethylene terephthalate (PET) at various web speeds using the system of FIG. 2 operating in band mode without an excess precursor removal mechanism 280, as described below. All WVTR data was collected using a water vapor transmission analyzer (WVTA) model 7001 manufactured by Illinois Instruments, Inc. of Johnsburg, Ill., USA. The model 7001 WVTA conforms to ISO 15105-2 and uses a modified ASTM standard that conforms to ISO 15106-3. WVTA measurements were conducted at 38° C. and 90% relative humidity. The 7001 WVTA has a lower sensitivity limit of 0.003 g/m$^2$/day, as illustrated by the broken line in FIG. 3.

As illustrated by FIG. 3, the barrier layer performance of $Al_2O_3$ films deposited at 0.15 m/s and even 0.3 m/s are comparable to $Al_2O_3$ films deposited in a conventional cross-flow traveling wave ALD reactor using 2 second pulses and 30 second purges (conventional ALD data illustrated by "X" icons). The system was operated in a clockwise rotation (opposite the direction indicated by arrows in FIG. 2) to gather the data presented FIG. 3. At web transport rates of 0.3 m/s, the isolation zone dwell in the system of FIG. 2 was approximately 1 second following exposure to the water precursor in second precursor zone 216 and approximately 0.5 second following exposure to TMA in first precursor zone 214. $Al_2O_3$ films deposited by the system of FIG. 2 at a web transport rate of 0.5 m/s (isolation zone dwell after water exposure=approximately 0.6 seconds) exhibited an increased WVTR and would require about 30 Å of additional film thickness (approximately 30 additional deposition cycles) to achieve the same barrier performance as films deposited in the conventional ALD reactor.

Figure 5:
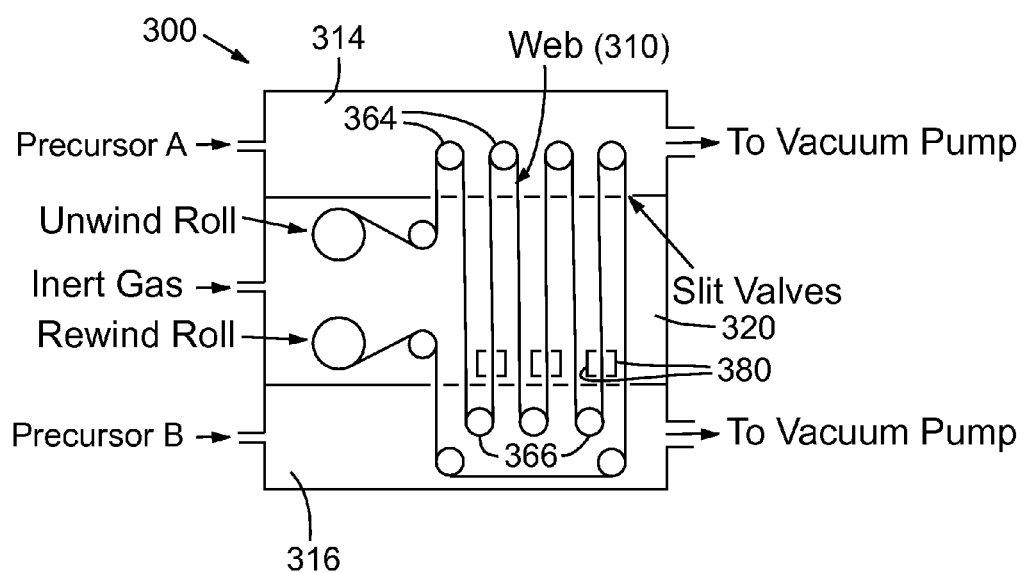
FIG. 5 is a simplified schematic cross-sectional diagram of a thin film deposition system in accordance with an embodiment illustrating a method for roll-to-roll ALD on a flexible substrate.

FIG. 5 illustrates an experimental system 300 for roll-to-roll ALD deposition similar to the system 10 of FIG. 1, but which is more compact and performs fewer deposition cycles per pass of the substrate 310. Unlike the band mode system of FIG. 2, during each deposition cycle in the roll-to-roll system configuration illustrated in FIG. 5 the substrate web 310 does not traverse across the entire length of the system 300 in each precursor zone 314, 316, but instead just turns around each of the rollers 364, 366 and back into the isolation zone 320. Thus, for a given substrate web transport speed the precursor zone dwell times are shorter in roll-to-roll mode (FIGS. 1 and 5) than in band mode (FIG. 2), but the isolation zone dwell times are the same. For example, at a web speed of 0.15 m/s the precursor zone dwell times are about 1 second and the isolation zone dwell times are about 1-2 seconds. WVTR performance similar to that illustrated in FIG. 3 is expected using a roll-to-roll deposition system configuration, including similar WVTR degradation at high web transport speeds and low isolation zone dwell times.

It is believed that there are two main factors leading to reduced barrier performance at higher web transport speeds. A first factor is that for a given precursor partial pressure in a precursor zone there is some speed at which the exposure dose of that precursor is insufficient to saturate. This insufficient dose will impact barrier performance before it impacts the deposition rate (thickness). At very high precursor doses (e.g., sufficient dwell time) the precursor is able to diffuse into cracks, pores, and around particles, thus sealing the thin film to better inhibit moisture penetration. As the precursor dose is reduced by a reduction in dwell time, the ability of the precursors to fill in these cracks, pores, and other irregularities is reduced, resulting in reduced barrier performance. As the precursor dose is reduced further, the deposition rate as measured on the surface of the substrate will eventually be reduced and result in thinner deposited films, but only after the dose is reduced well below the level where barrier performance starts to be affected.

A second factor that will cause reduced barrier performance at higher web speeds involves transport of excess precursor from one precursor zone to another precursor zone.

For example, after the substrate is exposed to the $H_2O$ precursor zone, the surface of the growing $Al_2O_3$ film is expected to be saturated with hydroxyl groups (—OH) from the chemisorption of the $H_2O$ precursor. However, if excess $H_2O$ is carried by the surface, then CVD deposition and gas phase particle formation can occur when it reaches the TMA precursor zone, resulting in degradation of WVTR and other barrier performance. Similar deleterious reactions may take place if excess water vapor is swept into the TMA precursor zone by viscous drag caused by the moving web. Experimental results suggest that at high web transport speeds (>0.5 m/s and isolation zone dwell times below about 0.5 seconds) excess water carried by the substrate is attached to the surface by physisorption or another mode that is not chemisorption, rather than being swept by viscous drag.

As the transport speed of the web substrate 210 is reduced, it is expected that a speed should be reached below which the substrate dwell time in each precursor zone 214, 216 is sufficient to saturate the surface of the web 210 with adsorbed precursor or to react fully with the previously adsorbed precursor at the surface, and that the substrate dwell time in the isolation zone 220 is sufficient to allow any excess precursor to be removed by the inert gas in the isolation zone. The particular speed at which these criteria are met will depend on the specific precursors, the temperature and pressure in the zones 214, 216, 220, and other parameters such as tool geometry, inert gas flow, etc.

Figure 4:
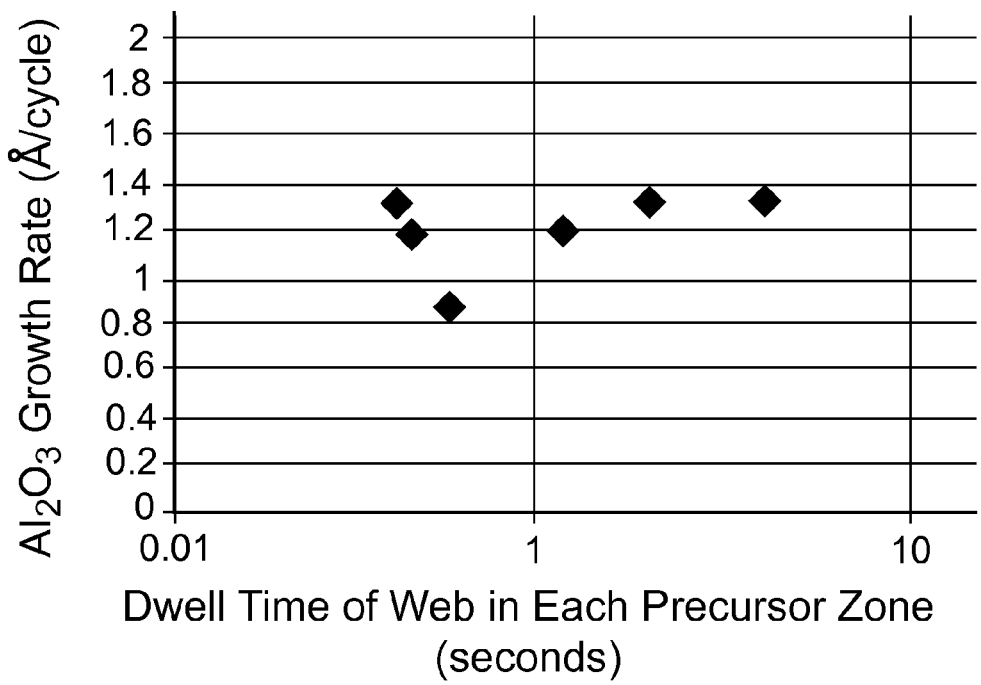
FIG. 4 is a scatter plot illustrating deposition rate as a function of dwell time in each precursor zone (saturation curve) for $Al_2O_3$ films deposited using the system of FIG. 2 in band mode at 75° C.

FIG. 4 illustrates saturation data for experiments performed using a system according to FIG. 2 (without the excess precursor removal mechanism 280 described below). With reference to FIG. 4, the process appears to be saturated and performing as true ALD for precursor zone dwell times over about 2 seconds, with web speeds below about 0.3 m/s and isolation zone dwell times over about 0.5 seconds. In comparison, true saturation was not achieved in a conventional cross-flow traveling wave ALD reactor at approximately the same temperature and pressure and precursor pulse times of over 5 seconds, even with purge times of several minutes per cycle. The web coater process illustrated in FIG. 2 (without the excess precursor removal mechanism 280) follows a normal saturation curve down to about 0.6 second precursor zone dwell times, and corresponding to web speeds of up to approximately 1.0 m/s web and isolation zone dwell times of down to approximately 0.2 second following water precursor exposure. As illustrated by the data shown in FIG. 4, for shorter dwell times (i.e., faster web speeds and isolation zone dwell times below approximately 0.2 second), the thin film deposition rate starts rising again due to transport of excess $H_2O$ by the fast moving web, which appears to result in CVD deposition. These higher deposition rates at very fast web speeds are not useful since the barrier properties of the film are poor, the growth is non-uniform, and the walls of the TMA precursor zone chamber 214 walls start to accumulate coatings of film and powder.

The transport of excess non-chemisorbed precursor demonstrated by FIG. 4 may also occur with precursors other than water at some combination of process conditions and high substrate transport speed, although such behavior would not be expected for other precursors except perhaps in a system configuration enabling sufficient precursor zone dwell times but much shorter isolation zone dwell times. For example, a precursor that tends to adhere strongly to itself (e.g., a precursor that has a relatively high surface tension against the inert gas used to isolate the precursors from one another) and/or that exhibits strong physisorption to the surface of the substrate may be more likely to be transported with the substrate into the other precursor zone. In general, precursors having a lower vapor pressure will tend to adhere to the surface and be more difficult to remove. Consequently, the methods and systems for excess precursor removal may be particularly useful when using precursors having a low vapor pressure, such as less than 5 Torr or less than 1 Torr, at the process temperature (i.e., the temperature of the overall system 200, 300 and substrate 210, 310)—such as, $TiCl_4$ at room temperature (about 20-25° C.), Tantalum ethoxide $Ta(OC_2H_5)_5$ at approximately 100-200° C., ethylmethylamido zirconium at approximately 70-140° C., or ethylmethylamido hafnium at approximately 70-140° C.

Inhibiting Transport of Excess Precursor Between Precursor Zones

Increasing the substrate temperature is believed to reduce and in many cases eliminate the problem of non-ALD deposition in conventional cross-flow traveling wave reactors, and to the extent that the operating temperature can be increased in a translation based process as illustrated in FIGS. 1, 2, and 5, similar improvements should be realized. However, for substrates which can't tolerate high temperatures, such as polymers like PET and BOPP (bi-axially oriented polypropylene), substrate temperatures are limited to the 50° C. to 150° C. range. May polymers tend to degrade at elevated temperatures through changes in their polymer cross-linkage, degradation of molecular bonds, changes in crystalline structure, dielectric properties, melting, deformation (stretching), or other physical or chemical degradation affecting desired substrate material properties.

In roll-to-roll and band mode web transport ALD systems described herein, the present inventors have devised systems and methods for introducing high temperature conditions locally in the isolation zone. Localized short-duration exposure to high temperatures make it possible to heat the surface of the thin film to an elevated temperature to remove or drive off excess water or other excess precursor molecules that are not chemisorbed to the surface, while not heating the substrate itself beyond its temperature limits. For example, the systems and methods described below may include a steady-state source of heat or electromagnetic radiation operable to generate internal temperatures within the substrate that would tend to degrade the substrate when the substrate is not moving relative to the source of heat or electromagnetic radiation—such as temperatures greater than 100° C., 150° C., 200° C., 300° C., 400° C., 500° C., 800° C., or 1000° C., depending on the type of mechanism and needs of operation. However, excess non-chemisorbed precursor may be removed without degrading the substrate by exposing each point on the surface of the thin film to the elevated temperature only momentarily—for example, localized temperatures in excess of 150° C. for less than 0.5 second, less than 0.1 second, less than 0.05 second or less than 0.01 second, depending on substrate transport speed; or localized temperatures in excess of 200° C. for less than 0.1 second, less than 0.05 second, less than 0.01 second, less than 0.005 second, or less than 0.001 second, depending on substrate type and transport speed. At these exposure times, the exposure to the heat source or other source of energy should not be sufficient to significantly raise the internal temperature of the substrate, as the heat should not conduct very far beneath the surface of the thin film coating, and subsequent transport through the lower-temperature precursor zones will enable surface heat to dissipate. Similar systems and methods could be employed with a moving deposition head of the kind described by Levy (U.S. Pat. No. 7,413,982).

In embodiments, an excess precursor removal mechanism 280, 380 (FIGS. 3 and 5) includes a source of heated inert gas or other fluid introduced locally near the surface of the substrate 210, 310 as the substrate 210, 310 exits the water precursor zone 216, 316 and enters the isolation zone 220, 320. For example, with a system operating temperature of approximately 80° C., 1.5 Torr, and substrate translation speed of 0.15 m/s, a nitrogen gas heated to temperatures of up to 250° C. was injected at a flow rate of 5 standard liters per minute (slm), which increased the surface temperature of the PET substrate by approximately 20-50° C., as measured by a low mass thermocouple, without compromising the integrity of the PET substrate. In some embodiments, it may be beneficial to inject a fluid heated to a temperature in the range of 100° C. to 500° C., depending on the substrate material, substrate thickness, overall flow, and proximity of the injection point of the heated fluid relative to the substrate. For a substrate like polyethylene naphthalate (PEN), or thermally stabilized PET (which can tolerate internal temperatures up to 150° C. or even 180° C.), gas heated up to 500° C., and directed at or nearby to the substrate surface, at flow ranges of 1 slm to 20 slm may be appropriate.

In other embodiments, excess precursor removal mechanisms 280, 380 may include a heater, such as one or more sources infra-red radiation interposed between the first precursor zone 214 or 314 and second precursor zone 216 or 316 at a location proximal of the moving web 210, 310 where it exits the water precursor zone 216, 316 on its way toward the TMA precursor zone 214, 314. A variant which might further optimize the process includes an infrared source that emits radiation over only a narrow band of wavelengths that are absorbed by water, such as approximately 1400 nm wavelength region and/or the 1900 nm wavelength region.

In one example, mechanism 280, 380 comprises an infrared heater having a width of 5 cm in the direction of travel of the substrate web is operated at a steady-state temperature in the range of 200° C. to 1000° C., the substrate is transported at a rate of approximately 2-5 m/s, the overall system operating temperature is 75° C., and operating pressure is 5 Torr, using TMA and water as precursors. Under these conditions, the high temperature exposure (for approximately 0.01 to 0.025 seconds) is expected to dislodge excess water precursor and substantially prevent its transport into the TMA zone without degrading the 100 μm PET substrate.

In further embodiments, a similar local heating technique could be employed in a precursor zone for a different reason—to enable the use of alternative precursors (other than water), such as ethanol, isopropyl alcohol, tert-butyl alcohol (tert-butynol), or highly oxidizing precursors such as hydrogen peroxide. For example ethanol and tert-butynol have been shown to be effective as co reactants for TMA, but only at relatively high temperatures which may exceed the temperature above which substrate degradation occurs. For these co-reactants, localized heat could be introduced in some portion of the oxygen precursor zone and/or the TMA precursor zone.

In yet other embodiments, the excess precursor removal mechanism 280, 380 adds energy other than heat at the surface of substrate web 210, 310 to dislodge at least a portion of the excess non-chemisorbed water molecules carried by the substrate 210, 310. For example, an excess precursor removal mechanism 280, 380 comprising a simple plasma generation device, such as a DC glow discharge or RF discharge, may be used in the isolation zone or proximal to the water precursor zone 216, 316. The plasma generator could be designed to confine the plasma to a small region of the isolation zone 220,320, to thereby limit substrate heating for a given energy level of the plasma due to movement of the substrate past the plasma generator or vice versa. In one example, a DC plasma generator with an electrode 2 cm in length (in the direction of travel of the substrate) may enable a 5× or greater increase in web transport speed (e.g., 5-10 m/s or more) without damaging 100 μm thick PET substrate, when operating the system at 75° C. and 5 Torr.

In still other embodiments, excess precursor removal mechanism 280, 380 includes a source of microwaves tuned to oscillate and heat the excess precursor carried by the substrate. Such a device would heat the excess precursor without significantly adding heat to the substrate itself, as the source may be selected to generate radiation at wavelengths affecting only the specific precursor molecules and not the substrate and may be sized so that a point on the substrate is exposed to the radiation for only a short duration as the substrate is transported past the microwave source or vice versa. In other embodiments, a microwave source may be used to generate a plasma. In some such embodiments, a microwave source may both generate a plasma from the inert gas and cause precursor-specific heating—both of which may contribute to the removal or liberation of the unwanted excess non-chemisorbed precursor from the surface of the substrate.

Another kind of excess precursor removal mechanism involves a chemical mechanism for removing the unwanted excess non-chemisorbed precursor (especially water) from the surface of the web. International Publication No. WO 2009/004117 A1 (Beneq Oy) describes exposing the substrate to chemicals that form azeotropes with the excess precursor. Although many such azeotropes of the kind described in the WO '117 publication may not be effective to liberate excess water below the 50-150° C. operating temperature ranges useful with polymer substrates, water removal using such azeotropes may be enabled by localized heating, either in conjunction with the surface heating methods described above, by heating the azeotrope vapor itself, or by heating a carrier gas which delivers the azeotrope. It is expected that certain materials that form azeotropes with water, especially positive azeotropes having higher vapor pressure, would work at lower temperatures—examples include: benzene, butyl chloride, carbon disulfide, chloroform, chloropropane, ethyl formate, isopropyl ether, isopropyl chloride, methylene chloride, methylvinyl chloride, pentane, propyl chloride, vinylethyl ether, acrolein, allyl chloride, methyl acetate, and propionaldehyde. Thus, the excess precursor removal mechanism 280, 380 may comprise a source of materials that form azeotropes with the excess precursor; and, in some embodiments, may further comprise a heater or other mechanism for adding energy to increase the temperature of the azeotrope, once formed.

For many of the above approaches, it would be useful to locate the excess precursor removal mechanism 280, 380 within the isolation zone 220, 320 but near the water precursor zone 216, 316. The excess precursor removal mechanism may be located on a single side of the substrate, as illustrated by mechanism 280 in FIG. 2, or may straddle the substrate or otherwise expose both sides of the substrate, as in the mechanisms 380 of FIG. 5. As illustrated in FIG. 5, multiple mechanisms 380 may be needed in a roll-to-roll system, for example, at each location in the isolation zone 320 where the substrate is transiting from the water precursor zone 316 to metal precursor zone 314. In some embodiments, it may be useful to locate the excess precursor removal mechanism 280, 380 in the water precursor zone 216, 316 at a location near where the substrate web 210, 310 exits the precursor zone 216, 316 and enters the isolation zone 220, 320, so that any desorbed or otherwise liberated water would be retained in water zone 216, 316, swept back into water zone 216, 316 by the flow of inert gas (due to the pressure differential described above), or otherwise exhausted from the isolation zone 220, 320 to inhibit the liberated water precursor from migrating into the other (metal) precursor zone 214, 314.

In some embodiments (not shown), one or more secondary isolation zones may be added to the system in series between the water precursor zone 216, 316 and the primary isolation zone 220, 320. The series of isolation zones may form an isolation stack through which the substrate passes as it transits between precursor zones 214 and 216 (or 314 and 316), and would enable a differential pressure to be established between each of the adjacent pairs of isolation zones in the stack to aid in directing the desorbed vapor back into the water zone and/or inhibiting desorbed water from migrating into the other (metal) precursor zone 214, 314. A stack of isolation zones may also provide for a throttling effect at slit valves between the isolation zones, for localized increases in inert gas flow velocity adjacent the substrate.

It will be obvious to those having skill in the art that many changes may be made to the details of the above-described embodiments without departing from the underlying principles of the invention. The scope of the present invention should, therefore, be determined only by the following claims.

The invention claimed is:

1. A method of depositing a thin film onto a substrate, comprising:
   introducing a first precursor gas into a first precursor zone;
   introducing a second precursor gas into a second precursor zone spaced apart from the first precursor zone, the second precursor gas different from the first precursor gas;
   imparting relative movement between the substrate and the precursor zones to sequentially expose the substrate to the first precursor zone, an isolation zone supplied with an inert gas, and the second precursor zone so that a thin film is formed on a surface of the substrate by:
      exposing the surface to the first precursor gas in the first precursor zone to leave a chemisorbed portion of the first precursor gas and an excess non-chemisorbed portion of the first precursor gas on the surface,
      after entering the isolation zone, momentarily exposing each portion of the surface to energy applied entirely within a border region of the isolation zone by an excess precursor removal mechanism located therein and to the inert gas within an interior region of the isolation zone that is separate from the border region, thereby momentarily activating removal of the excess non-chemisorbed portion from the surface without removing the chemisorbed portion, and
      exposing the chemisorbed portion to the second precursor gas in the second precursor zone so that the second precursor gas reacts with the chemisorbed portion to form the thin film.

2. The method of claim 1, wherein the relative movement includes exposing the surface to the inert gas in the interior region of the isolation zone after exposing the surface to the energy applied by the excess precursor removal mechanism within the border region.

3. The method of claim 1, wherein momentarily activating removal of the excess non-chemisorbed precursor includes exposing each portion of the surface to heat or electromagnetic radiation for a sufficiently short duration such that the substrate is not degraded by the heat or electromagnetic radiation.

4. The method of claim 1, wherein momentarily activating removal of the excess non-chemisorbed precursor includes exposing the surface to a plasma.

5. The method of claim 1, wherein momentarily activating removal of the excess non-chemisorbed precursor includes heating the surface.

6. The method of claim 1, wherein momentarily activating removal of the excess non-chemisorbed precursor includes exposing the surface to infrared radiation.

7. The method of claim 1, wherein momentarily activating removal of the excess non-chemisorbed precursor includes exposing the surface to microwave radiation.

8. The method of claim 1, wherein:
   the substrate is a flexible web; and
   imparting relative movement includes transporting the flexible substrate back and forth between the first and second precursor zones in alternating succession so that the substrate transits through the first and second precursor zones and the isolation zone multiple times.

9. The method of claim 3, wherein the substrate is a polymer film that degrades at internal temperatures exceeding 50 degrees Celsius.

10. The method of claim 3, wherein the substrate includes a material that degrades at internal temperatures exceeding 150 degrees Celsius.

11. The method of claim 3, wherein momentarily activating removal of the excess non-chemisorbed precursor includes momentarily exposing each portion of the surface to a steady-state source of heat or electromagnetic radiation operable to generate localized temperatures in excess of 150 degrees Celsius without degrading the substrate.

12. The method of claim 1, wherein momentarily activating removal of the excess non-chemisorbed precursor includes momentarily exposing each portion of the surface to a steady-state energy source included in the excess precursor removal mechanism for less than 0.5 second.

13. The method of claim 1, wherein momentarily activating removal of the excess non-chemisorbed precursor includes transporting the substrate at a rate of at least 0.15 m/s relative to the excess precursor removal mechanism so that each portion of the surface is momentarily exposed to the excess precursor removal mechanism without degrading the substrate.

14. The method of claim 2 wherein the relative movement includes moving the substrate between the first and second precursor zones in alternating succession multiple times to repeatedly, sequentially expose the substrate to the first precursor gas, the inert gas, the second precursor gas, and the inert gas.

15. The method of claim 1, wherein:
   the excess precursor removal mechanism includes a heated inert gas supply directed toward the surface, the inert gas being heated to a temperature greater than a degradation temperature of the substrate; and
   momentarily activating removal of the excess non-chemisorbed precursor includes momentarily heating each portion of the surface by transporting the substrate relative to the excess precursor removal mechanism so that each portion of the surface is momentarily exposed to the heated inert gas supply without degrading the substrate.

16. A method of depositing a thin film onto a substrate, comprising:
   introducing a first precursor gas into a first precursor zone;
   introducing a second precursor gas into a second precursor zone spaced apart from the first precursor zone, the second precursor gas reactive with the first precursor gas;

imparting relative movement between the substrate and the precursor zones so that a thin film is formed on a surface of the substrate by, in sequence:

exposing the surface to the first precursor gas in the first precursor zone to leave a chemisorbed portion of the first precursor gas and an excess non-chemisorbed portion of the first precursor gas on the surface, after entering the isolation zone, passing the substrate by an excess precursor removal mechanism that is smaller than the isolation zone to momentarily activate removal of the excess non-chemisorbed portion from the surface without removing the chemisorbed portion using energy from the excess precursor removal mechanism, and exposing the chemisorbed portion to the second precursor gas in the second precursor zone so that the second precursor gas reacts with the chemisorbed portion to form the thin film.

17. The method of claim 16, wherein passing the substrate by the precursor removal mechanism includes passing the substrate by the excess precursor removal mechanism positioned adjacent a location where the substrate enters the isolation zone.

18. The method of claim 16, wherein passing the substrate by the excess precursor removal mechanism includes exposing both sides of the substrate to the excess precursor removal mechanism.

19. The method of claim 16, wherein the relative movement includes exposing the surface to an inert gas in the isolation zone after exposing the chemisorbed portion in the second precursor zone.

20. The method of claim 19, wherein the relative movement includes moving the substrate between the first and second precursor zones in alternating succession multiple times to repeat the sequence of exposure to the first precursor gas, the inert gas, the second precursor gas, and the inert gas.

21. The method of claim 3, wherein the inert gas in the isolation zone is maintained at a temperature of about 150 degrees Celsius or less.

22. The method of claim 21, wherein the inert gas in the isolation zone is maintained at a temperature of less than 100 degrees Celsius.

* * * * *